United States Patent
Kim et al.

(10) Patent No.: US 9,007,564 B2
(45) Date of Patent: Apr. 14, 2015

(54) EXPOSURE APPARATUS INCLUDING LIGHT BLOCKING MEMBER WITH LIGHT CONDENSING PART

(75) Inventors: Chang-Hoon Kim, Asan-si (KR); Kab-Jong Seo, Seoul (KR); Hi-Kuk Lee, Yongin-si (KR); Tsunemitsu Torigoe, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 463 days.

(21) Appl. No.: 13/565,073

(22) Filed: Aug. 2, 2012

(65) Prior Publication Data

US 2013/0162965 A1  Jun. 27, 2013

(30) Foreign Application Priority Data

Dec. 26, 2011 (KR) ........................ 10-2011-0142628

(51) Int. Cl.
  *G03B 27/54* (2006.01)
  *G03B 27/32* (2006.01)
  *G03F 7/20* (2006.01)

(52) U.S. Cl.
  CPC .......... *G03F 7/70066* (2013.01); *G03F 7/7035* (2013.01); *G03F 7/70475* (2013.01)

(58) Field of Classification Search
  CPC   G06F 7/70066; G06F 7/7035; G06F 7/70475
  USPC ...................................................... 355/67, 77
  See application file for complete search history.

(56) References Cited

U.S. PATENT DOCUMENTS 7,417,712 B2 *  8/2008  Ando et al. ..................... 355/67

FOREIGN PATENT DOCUMENTS

| JP | 06-148543 A | 5/1994 |
|----|-------------|--------|
| JP | 2008040066 A | 2/2008 |
| JP | 2011023471 A | 2/2011 |
| KR | 1020050068475 A | 7/2005 |

* cited by examiner

*Primary Examiner* — Peter B Kim
*Assistant Examiner* — Michelle Iacoletti
(74) *Attorney, Agent, or Firm* — Cantor Colburn LLP (57) ABSTRACT

An exposure apparatus includes an irradiating part which irradiates light, a light blocking member including a light condensing part at a side of the light blocking member, where the light condensing part condenses the light, a mask which is spaced apart from the light blocking member by a first distance, and a transporting part which transports a target substrate in a first direction.

20 Claims, 6 Drawing Sheets

FIG. 7 ated Korean Patent Application No. 10-2011-0142628, filed on Dec. 26, 2011, and all the benefits accruing therefrom under 35 U.S.C. §119, the contents of which are herein incorporated by reference in their entireties.

EXPOSURE APPARATUS INCLUDING LIGHT BLOCKING MEMBER WITH LIGHT CONDENSING PART

This application claims priority to Korean Patent Application No. 10-2011-0142628, filed on Dec. 26, 2011, and all the benefits accruing therefrom under 35 U.S.C. §119, the contents of which are herein incorporated by reference in their entireties.

BACKGROUND

1. Field

Exemplary embodiments of the invention relate to an exposure apparatus. More particularly, exemplary embodiments of the invention relate to an exposure apparatus using a light condensing part.

2. Description of the Related Art

In a manufacturing process for a substrate, a size of the substrate increases for reducing a manufacturing cost. As the size of the substrate increases, the manufacturing machine or equipment also gets larger. Especially, a mask for patterning the substrate may be enlarged.

The enlargement of the mask greatly increases the manufacturing cost for the mask. The total manufacturing cost for the substrate may be undesirably increased due to the increasing cost for the mask. In order to reduce the total manufacturing cost, a number of alternatives are being explored. For example, a number of small masks instead of one large mask may be used in patterning the substrate.

In the exposing process using the small masks, a manufacturing cost for the masks is reduced and normal non-enlarged photo-lithography equipment is also used without significantly changing the manufacturing process. With a minimal change in the process, the total manufacturing cost may be greatly reduced.

A small mask exposure process uses a plurality of masks. In the equipment used in the exposure process, a light source head and the masks are fixed, and a constant gap between a glass substrate and the masks is maintained. The glass substrate is scanned and exposed by using the masks. Thus, the basic process of the small masks exposure process is substantially the same as a normal exposure process. However, the scan process is slightly changed in areas of fixing the glass substrate and moving the glass substrate.

However, when a pattern is formed on the substrate by using the small masks, light irradiated onto the substrate may not sufficiently reach an edge area of the pattern and a reduced amount of the light is provided compared to that of the remainder of the pattern. Thus, the pattern formed by using the small masks may be formed irregularly and the size of a contact hole disposed in the edge area of the pattern may be distorted, which may reduce the performance of the substrate.

The irregularly exposed edge area of the pattern may be disposed outside an exposure area of the substrate in order to reduce such exposure distortion. However, when the irregularly exposed edge area of the pattern is disposed outside the exposure area of the substrate, a total size of a periphery around the exposure area, e.g., a bezel, in the substrate is also greatly increased. An increased bezel may undesirably result in difficulty in designing a product using the substrate.

SUMMARY

One or more exemplary embodiments of the invention provide an exposure apparatus using a plurality of small masks.

According to an exemplary embodiment of the invention, an exposure apparatus includes an irradiating part which irradiates light, a light blocking member including a light condensing part at a side of the light blocking member, where the light condensing part condenses the light, a mask which is spaced apart from the light blocking member by a first distance and a transporting part which transports a target substrate in a first direction.

In an exemplary embodiment, the light condensing part of the light blocking member may include a lens.

In an exemplary embodiment, the light condensing part of the light blocking member may include a convex lens.

In an exemplary embodiment, a focus distance of the convex lens of the light condensing part may be substantially the same as the first distance.

In an exemplary embodiment, a focus distance of the convex lens of the light condensing part may be about 15 millimeters (mm).

In an exemplary embodiment, a diameter of the convex lens may be more than a parameter obtained by multiplying the first distance by tan θc, and the θc is defined as a collimation angle of the irradiating part.

In an exemplary embodiment, a diameter of the convex lens may be greater than about 470 micrometers (μm).

In an exemplary embodiment, the first distance may be less than about 20 mm.

In an exemplary embodiment, the first distance may be about 15 mm.

In an exemplary embodiment, a longitudinal axis of the light blocking member may be extended in a second direction substantially perpendicular to the first direction and a longitudinal side of the light blocking member is parallel to the longitudinal axis. A longitudinal axis of the light condensing part may be parallel with the longitudinal side of the light blocking member.

In an exemplary embodiment, the light condensing part may be at opposing longitudinal sides of the light blocking member.

In an exemplary embodiment, a width of the light blocking member in the first direction may be substantially the same with a width of a non-exposure area of the target substrate in the first direction.

In an exemplary embodiment, the light blocking member may be movable in the first direction with respect to the mask.

In an exemplary embodiment, an exposure rate of the target substrate may be controlled by a moving speed or a moving accelerated speed of the light blocking member.

In an exemplary embodiment, a plurality of light blocking members may be disposed at different heights from each other, be overlapped with each other and control a width of a non-exposure area of the target substrate by adjusting an overlapping area of the light blocking members.

In an exemplary embodiment, a width of the light blocking member in the first direction may be smaller than a width of a non-exposure area of the target substrate in the first direction.

In an exemplary embodiment, each of the light blocking members may have a different width.

In an exemplary embodiment, a plurality of the masks may be arranged in two rows.

In an exemplary embodiment, a plurality of the masks may be spaced apart from each other by a width of a non-exposure area of the target substrate, and a longitudinal axis of the non-exposure area is extended in a directly substantially parallel to the first direction.

According to one or more exemplary embodiments of the invention, a light blocking member blocks a portion of light provided from a irradiating part. An edge area, at which a material of a target substrate is not exposed, may be formed in a large-sized substrate by using a plurality of small masks. Moreover, a light condensing part of the light blocking member, which is disposed at a side of the light blocking member, reduces a light error generated by the light irradiating part. The boundary between an exposed area of the target substrate and a non-exposed area (e.g., an edge area) may be smaller and clearer.

BRIEF DESCRIPTION OF THE DRAWINGS

The above and other features of the invention will become more apparent by describing in detail exemplary embodiments thereof with reference to the accompanying drawings, in which.

DETAILED DESCRIPTION

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" or "under" relative to other elements or features would then be oriented "above" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be explained in detail with reference to the accompanying drawings.

Figure 1:
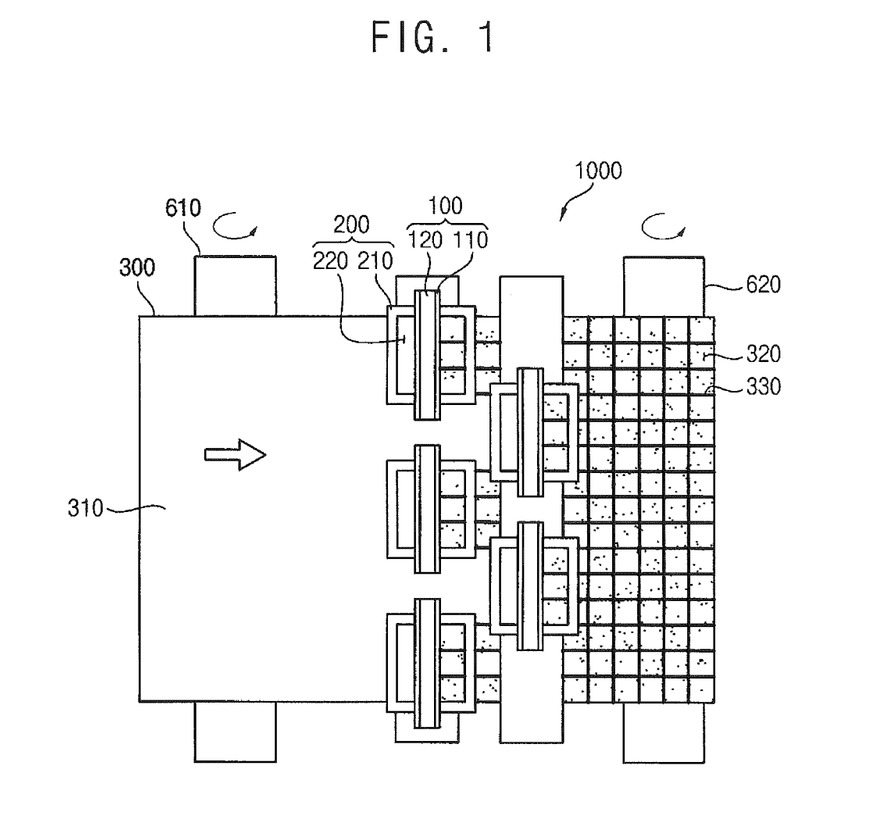
FIG. 1 is a plan view illustrating an exemplary embodiment of an exposure apparatus in accordance with the invention.

FIG. 1 is a plan view illustrating an exemplary embodiment of an exposure apparatus in accordance with the invention.

Referring to FIG. 1, an exemplary embodiment of an exposure apparatus 1000 in accordance with the invention includes an irradiating part, a light blocking member 100, a mask 200 and a transporting part 610 and 620. The exposure apparatus 1000 exposes coated materials on a target substrate 300 to light. The exposure apparatus 100 may include a plurality of light blocking members 100 and/or a plurality of masks 200.

The irradiating part irradiates light onto the target substrate 300 so as to activate the coated material on the target substrate 300 with the light. In the exemplary embodiment, the irradiating part is fixed at a specific position, and the target substrate 300 is moved to a position at which the irradiating part irradiates the light. In the exemplary embodiment, an exposing process is substantially the same as a normal exposing process except for using a plurality of masks 200. Thus, the light from the irradiating part may generate substantially the same light as is generated with the normal expose process.

A plurality of the light blocking members 100 blocks a portion of the exposure light. A plurality of the light blocking members 100 is disposed according to the plurality of the masks 200 and blocks a portion of the light provided to the plurality of masks 200. A mask 200 receives the light to form a pattern on the target substrate 300, and the mask 200 selectively provides the light to the target substrate 300. The light blocking member 100 is selectively used to block the light provided to the mask 200 and prevents the light from reaching to the substrate 300. Thus, when an area where the light is not entirely exposed is needed in the target substrate 300, a non-exposed area of the target substrate may be formed by using the light blocking member 100.

The light blocking member 100 includes a body part 120 and a light condensing part 110 which condense an exposure light from the irradiating part. The body part 120 is substantially strip-shaped, e.g., like a long, narrow band, and blocks the light generated from the irradiating part. In the area of the target substrate 300 which is overlapped by the body part 120, the light is not provided and the overlapped area is not exposed to the light. The light blocking member 100 is adjusted to a relative position according to the pattern of the mask 200.

The light blocking member 100 includes the light condensing part 110 which condenses the exposure light and is disposed at a side of the body 120 of the light blocking member 100. The light condensing part 110 reduces or effectively prevents distortion of the light which may occur at the side of the body part 120 of the light blocking member 100. In particular, the light condensing part 110 includes a lens condensing the light generated from the irradiating part at the side of the body part 120 of the light blocking part 100. Thus, the light condensing part 110 reduces or effectively prevents spreading or a parallel path of the light generated by the irradiating part, for example, by focusing the light. Thus, since the exposure light is focused at particular positions, a boundary between a light-blocked area and a light-transferred area in the target substrate 300 may be clearly exposed.

The plurality of masks 200 includes a pattern, which corresponds to the pattern that will be formed at the target substrate 300. The light generated at the irradiating part passes through the plurality of masks 200 according to the pattern of the plurality of masks 200, and the pattern of light is irradiated onto the target substrate 300, such that the pattern will be formed on the target substrate 300 by exposing the coated material on the target substrate 300.

The mask 200 includes a pattern part 220 and a non-pattern part 210. The pattern part 220 includes a pattern, which will be formed on the target substrate 300 by using the light generated at the irradiating part. When a non-exposure area is needed in the pattern part 220 to correspond to the non-exposure area of the target substrate 300, the non-exposure area of the target substrate 300 is formed by blocking the light at an area of the pattern part 220 which has a longitudinal axis which extends in a direction parallel to a moving direction of the target substrate 300.

However, when the non-exposure area of the target substrate 300 is formed in a direction perpendicular to the moving direction of the target substrate 300, a corresponding non-exposure area in the pattern part 220 cannot be formed. When the non-exposure area of the pattern part 220 extends perpendicular to the moving direction of the target substrate 300, the pattern part 220 forms a continuous light blocking pattern, and light from the irradiating part cannot be locally controlled.

In order to form the non-exposure area of the target substrate 300 which has a longitudinal axis extending in the direction perpendicular to the moving direction of the target substrate 300, the light blocking member 100 is used. The light blocking member 100 is strip-shaped like a long, narrow band, having a longitudinal axis which is extended in a direction perpendicular to the moving direction of the target substrate 300. The light blocking member 100 forms the non-exposure area of the target substrate 300 perpendicular to the moving direction, which could not be formed by a corresponding area in the pattern part 220 of the mask 200.

The mask 200 is spaced apart from the light blocking member 100 by a first distance in a direction perpendicular to the target substrate 300. The distance between the mask 200 and the light blocking member 100 is much greater than the distance between the mask 200 and the target substrate 300. Thus, when the light is incident with a constant collimation angle, the possibility of error between the mask 200 and the target substrate 300 is very low, however, the possibility of error between the light blocking member 100 and the mask 200 or between the light blocking member 100 and the target substrate 300 is very high. With the error, a gray area, which is not completely exposed, is formed between the non-exposure area and the exposure area of the target substrate 300. The gray area degrades the quality of the target substrate 300.

A transporting part 600 (see FIG. 2) moves the target substrate 300 in a first direction. The transporting part 600 includes at least two roller transporting parts 610 and 620 which rotate as indicated by the circular arrows, to move the target substrate 300 in the first direction, for example, in the left-to-right direction in FIG. 1 as indicated by the outlined arrow. The exposure apparatus 1000 in the exemplary embodiment moves the target substrate 300 to an exposure position at which the target substrate 300 is exposed to the irradiated light using the plurality of masks 200. A moving speed of the target substrate 300 may be substantially the same as a moving speed of the light blocking member 100. When the moving speeds of the light blocking member 100 and the target substrate 300 are substantially the same, the non-exposure area is formed on the target substrate 300 to have the width of the light blocking member 100. Moreover, when the moving speed of the light blocking member 100 is faster or slower than the moving speed of the target substrate 300, the width of the non-exposure area may still be be controlled. Moreover, when the accelerated moving speed of the light blocking member 100 is controlled, the width of the non-exposure area may be controlled.

The light blocking member 100, the mask 200 and the target substrate 300 are disposed under the irradiating part in sequence. The exposure light generated at the irradiating part is irradiated directly onto the mask 200 without being blocked, to form a pattern on the target substrate 300 corresponding the pattern of the pattern part 220 of the mask 200. A portion of the exposure light generated by the irradiating part is blocked by the light blocking member 100, and a remaining portion of the exposure light forms a light pattern according to the pattern part 220 of the mask 200 and arrives at the target substrate 300.

The light blocking member 100 is dimensioned to be relatively smaller than the mask 200, for example, in a planar view. In particular, a width of the light blocking member 100 may be no more than a width of the non-exposure area of the target substrate 300. The widths are taken perpendicular to a longitudinal axis of the non-exposure area, for example, in the moving direction. When the width of the light blocking member 100 is smaller than the width of the non-exposure area of the target substrate 300, the light blocking member 100 may be moved relative to the moving target substrate 300 to effectively achieve the wider width, or a plurality of the light blocking members 100 may be used to overlap with each other to form the wider width of the non-exposure area of the target substrate 300.

Figure 2:
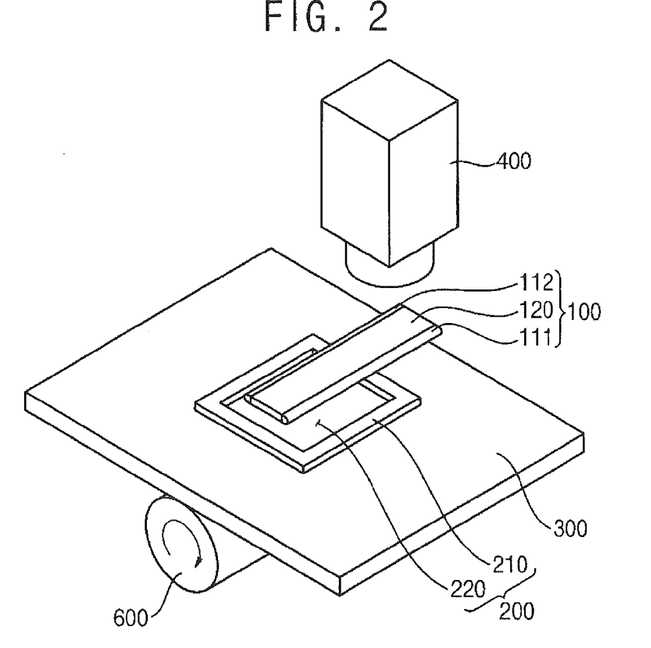
FIG. 2 is a partial perspective view illustrating the exposure apparatus in FIG. 1.

The mask 200 is dimensioned to be relatively smaller than the target substrate 300, and a plurality of the masks 200 is arranged along a row as illustrated in FIG. 2. The target substrate 300 is transported by the transporting part 610 and 620 to the position where the irradiating part, the light blocking member 100 and the mask 200 are disposed. A plurality of the masks 200 may be arranged in two or more rows. A plurality of the masks 200 is arranged so that the pattern parts 220 are not overlapped with each other and are not spaced apart from each other. That is, the pattern parts 220 may be directly adjacent to each other. A plurality of masks 200 is arranged so that the exposure area of the target substrate 300 is continuous after being exposed by using a plurality of small masks 200. If necessary, the plurality of masks 200 is arranged in three or more rows. As an exemplary embodiment, the plurality of masks 200 is arranged in two rows for the continuous exposure of the target substrate 300.

Referring to FIG. 1, the target substrate 300 includes a non-exposed area 310, a pattern area 320 and an edge area 330 which is indicated by the dark matrix of lines. The non-exposed area 310 is transported to a place where the plurality of masks 200 is disposed. After exposing the target substrate 300 using the plurality of masks 200, the non-exposed area 310 becomes the pattern area 320 or the edge area 330. The exposed target substrate 300 includes the pattern area 320 and the edge area 330. The pattern area 320 is the area where the pattern of the target substrate 300 is formed by the mask 200. In the pattern area 320, the light is not blocked by the light blocking member 100 and the light generated by the irradiating part passes directly through the mask 200 and arrives at the target substrate 300.

The light condensing part 110 is at the side of the light blocking member 100. The side of the light blocking member 100 may be matched with a boundary of the edge area 330 of the exposed target substrate 300. The irradiating part does not provide the exposure light perpendicular to an upper surface of the target substrate 300. The light generated by the irradiating part has a collimation angle. Even if a second distance between the mask 200 and the target substrate 300 is relatively small, the the light blocking member 100 and the mask 200 are spaced apart from each other by the first distance which is greater than the first distance. The light arriving at the mask 200 from the light blocking member 100 has a light error generated by the collimation angle and the first distance. The light condensing part 110 controls the light error generated by the collimation angle and the first distance.

FIG. 2 is a partial perspective view illustrating the exposure apparatus in FIG. 1.

Referring to FIG. 2, the exemplary embodiment of exposure apparatus 1000 includes the irradiating part 400, the light blocking member 100, the mask 200 and the transporting part 600. The exposure apparatus 1000 photo-reacts the coated material on the target substrate 300. The irradiating part 400 generates and irradiates the light toward the target substrate 300. The light generated by the irradiating part 400 is formed into the light pattern by the mask 200 and arrives at the target substrate 300. The light pattern which is formed by the mask 200 arrives at the target substrate 300 forms the pattern on the target substrate 300 from the coated material.

The irradiating part 400 irradiates the light toward the target substrate 300. the mask 200 is fixed and the target substrate 300 is transported relative to the mask 200 by the transporting part 600, and the target substrate 300 is exposed. The mask 200 has a relatively smaller size than the target substrate 300. A plurality of the masks 200 is arranged in one row. In FIG. 2, only one mask 200 is illustrated for better detail description.

The longitudinal axis of the light blocking member 100 is disposed substantially perpendicular to the moving direction of the target substrate 300. The light blocking member 100 may be repositioned by another transporting part (not shown) in a direction which is opposite to the moving direction of the target substrate 300. The light blocking member 100 is a long strip-shaped member. The mask 200 includes a pattern part 220 and a non-pattern part 210.

The light blocking member 100 is disposed relative to the pattern part 220 of the mask 200. The pattern part 220 of the mask 200 may include an area at which the light does not reach. The light blocking member 100 may include light condensing parts 111 and 112 at the side of the light blocking member 100. The light condensing parts 111 and 112 have a long strip shape, which has a longitudinal axis extended in a direction substantially perpendicular to the moving direction of the target substrate 300. The light condensing parts 111 and 112 are respectively at both of opposing sides of the light blocking part 100. The light condensing parts 111 and 112 condense the light arriving at the side of the light blocking member 100 when the light generated by the irradiating part 400 passes through the side of the light blocking member 100. Since the light at the side of the light blocking member 100 is condensed by the light condensing parts 111 and 112, the possible light error generated by the collimation angle of the light and/or the first distance between the light blocking part 100 and the mask 200, is reduced.

When the entire of the light generated at the irradiating part 400 is required to arrive at the mask 200, the light blocking member 100 can be moved away from the pattern part 220 of the mask 200 such that the light blocking member 100 does not overlap any portion of the pattern part 220. In one exemplary embodiment, for example, the light condensing part 110 of the light blocking part 100 may be moved to overlap the non-pattern part 210 of the mask 200.

Figure 3:
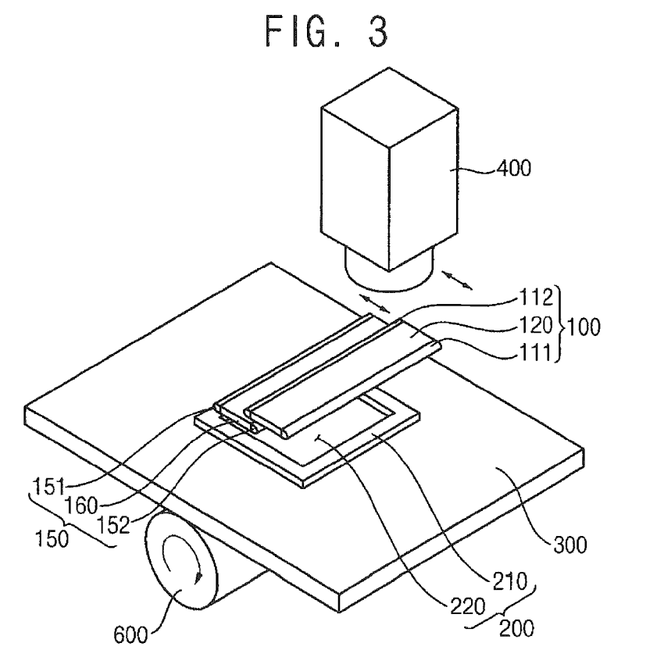
FIG. 3 is a partial perspective view illustrating another exemplary embodiment of an exposure apparatus in accordance with the invention.

FIG. 3 is a partial perspective view illustrating another exemplary embodiment of an exposure apparatus in accordance with the invention.

Referring to FIG. 3, the exemplary embodiment of an exposure apparatus includes two light blocking members 100 and 150. Hereinafter, the light blocking members 100 and 150 may be referred to as a first light blocking member 100 and a second light blocking member 150. The first and second light blocking members 100 and 150 are disposed overlapping the mask 200 as a pair. The first light blocking member 100 and the second light blocking member 150 are disposed on the mask 200 and may be moved in the moving direction of the target substrate 300 or the direction opposite to the moving direction by the other transporting part (not shown), as indicated by the double-headed arrows in FIG. 3.

The first and second light blocking members 100 and 150 are disposed at different heights with respect to the target substrate 300. The first and second light blocking members 100 and 150 may be moved independently and overlap with each other to collectively form the non-exposure area of the target substrate 300. The first and second light blocking members 100 and 150 control the width of the non-exposure area finally formed on the target substrate 300 by adjusting the width of the overlapping area of the first and second light blocking members 100 and 150. Thus, different widths of a non-exposure area according to various target substrates 300 can be achieved. If necessary, three or more light blocking members may be used. The three or more light blocking members are disposed at different heights from each other with respect to the target substrate 300 and are movable independent from each other.

The first and second light blocking members 100 and 150 may have a width which is smaller than a width of the edge area 330 generated on the target substrate 300. The first and second light blocking members 100 and 150 determine the width of the edge area 330 on the target substrate 300 by the overlapped area of the first and second light blocking members 100 and 150 being adjusted. If necessary, the exposure apparatus may further include another light blocking member having a narrow width which controls the width of the edge area 330.

Figure 4:
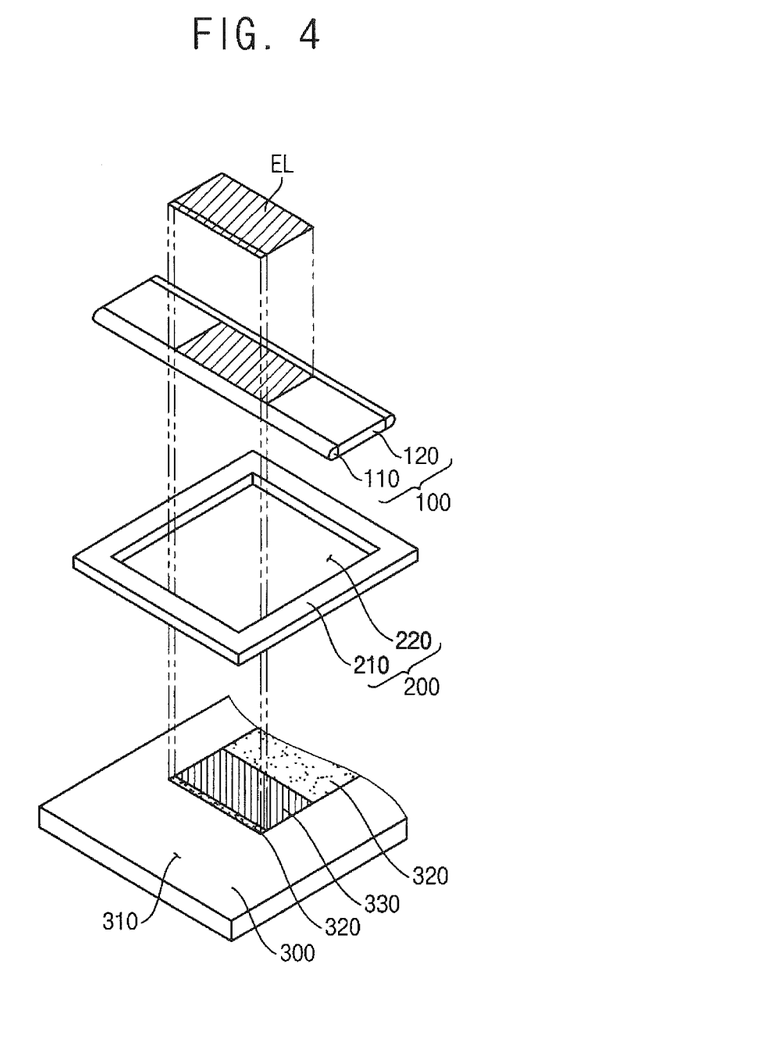
FIG. 4 is a perspective view illustrating an exemplary embodiment of a blocking member of the exposure apparatus in FIG. 1.

FIG. 4 is a perspective view illustrating a blocking member of the exposure apparatus in FIG. 1.

Referring to FIG. 4, the light EL generated at the irradiating part 400 arrives at the mask 200 after passing through the light blocking member 100. The light passing through the mask 200 arrives at the target substrate 300. In order to form the edge area 330 between pattern areas 220 on the target substrate 300, the light blocking member 100 blocks the light EL generated at the irradiating part 400. The light is blocked by the body part 120 of the light blocking member 100, and the light EL passes through a side of the light blocking member 100 adjacent to the body part 120. In the area where the light is not blocked by the light blocking member 100, the light passes through the light condensing part 110 at the side of the light blocking member 100 and arrives at the mask 200 and the target substrate 300. The light EL forms the pattern area 320 from the coated material on the target substrate 300.

The light condensing part 110 is disposed at a boundary between the area where the light is blocked by the light blocking member 100 and the area where the light is not blocked. In the area where the light condensing part 110 is disposed, the light has a tendency to spread according to the collimation angle of the light when the light arrives at the mask 200 or the target substrate 300. An error of the light occurs by the collimation angle of the light when the light is generated by artificial equipment, that is, non-natural occurring light. The light condensing part 110 includes a lens and compensates for the collimation angle when the light passes through the lens of the light condensing part 110. The light passing through the light condensing part 110 is arranged to be substantially perpendicular to the target substrate 300 or is focused to a specific area on the target substrate 300 by the lens compensation.

The compensated light results in the boundary between the pattern area 320 and the edge area 330 of the target substrate 300 to be clearer such that the boundary is more defined. When the light is not compensated, light spreads to disperse to a wider area with the same light amount. The intensity of the exposure to the light becomes weaker at the target substrate 300. Thus, the pattern formed in the pattern area 320 is influenced by the weaker light. When the pattern in the pattern area 320, for example, is less defined or compromised by the weaker exposure, a circuit including the pattern may malfunction or fail. In one exemplary embodiment, for example, the circuit may be included in a display substrate for a display apparatus. In order to prevent the circuit malfunction or failure, the edge area 330 may be disposed at a peripheral area outside of the exposure or pattern area 220 area of the substrate, e.g., a bezel part. When the edge area 330 is disposed at the peripheral area, the width of the bezel part is increased and a design of a final product including the substrate may be degraded.

Figure 5:
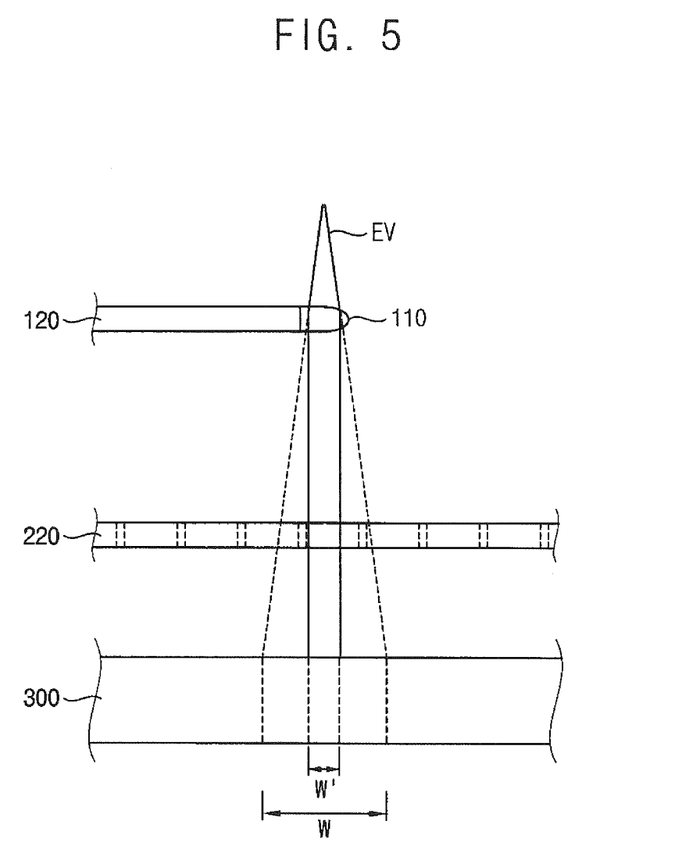
FIG. 5 is a perspective view illustrating an exemplary embodiment of a light condensing member of the exposure apparatus in FIG. 1.

FIG. 5 is a perspective view illustrating an exemplary embodiment of a light condensing member of the exposure apparatus in FIG. 1.

Referring to FIG. 5, the light EL generated at the irradiating part 400 is irradiated toward the target substrate 300. The light rays within light EL generated at the irradiating part 400 are not precisely parallel to each other and generates a collimation angle of the light EL. As a limitation of light generating equipment, the collimation angle of a normal irradiating part is about 1.8 degrees. The distance between the light condensing part 110 of the light blocking member 100 and the pattern part 220 of the mask 200 is much greater than the distance between the pattern part 220 of the mask 200 and the target substrate 300.

The distance between the light condensing part 110 of the light blocking member 100 and the pattern part 220 of the mask 200 is more than about 15 millimeters (mm). The distance between the pattern part 220 of the mask 200 and the target substrate 300 is about 200 micrometers (μm) to about 300 μm. Thus, the greater error occurs with the light passing through the light condensing part 110 of the light blocking member 100 and arriving at the pattern part 220 of the mask 200. The light condensing part 110 includes a convex lens to reduce or compensate the error. The light condensing part 110 controls the dispersement of the light EL having collimation angle generated by the irradiating part 400. The resulting light EL travels in a substantially perpendicular direction to the target substrate 300 due to the light condensing part 110.

Referring to FIG. 5, the light, which is not condensed by the light condensing part 110, has a first response width W when it is incident on the target substrate 300. The light, which is condensed by the light condensing part 110, has a second response width W' when it is incident on the target substrate 300. The second response width W' is substantially the same with an initial response width of the light EL incident on the light condensing part 110. Moreover, the second response width W' may be controlled to be smaller than the initial width when the light EL arrives at the light condensing part 110.

Figure 6:
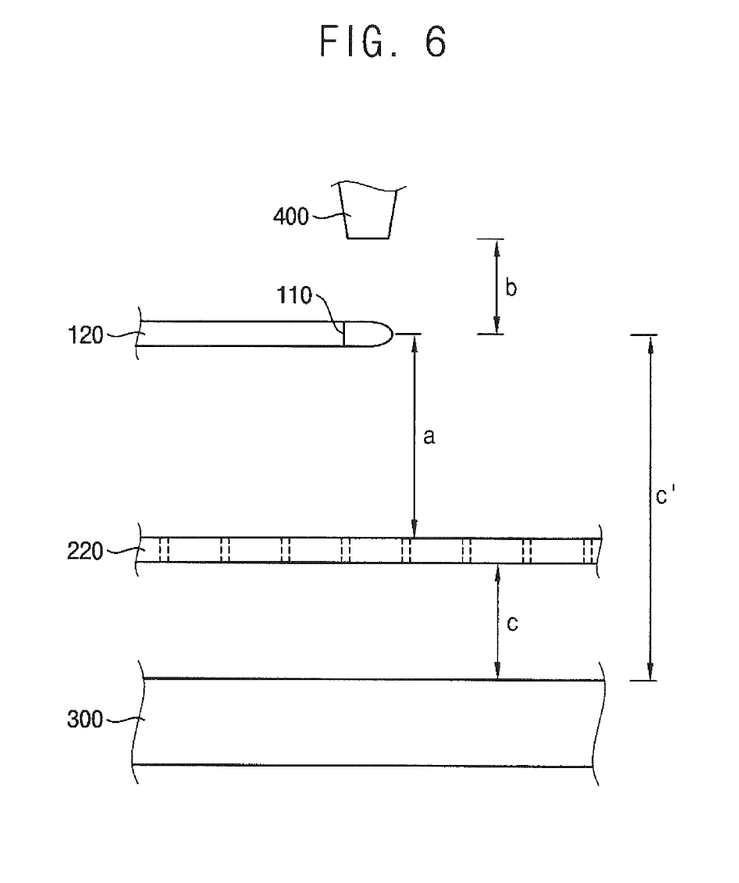
FIG. 6 is a partial cross-sectional view illustrating the exposure apparatus in FIG. 1.

FIG. 6 is a partial cross-sectional view illustrating the exposure apparatus in FIG. 1.

Referring to FIG. 6, the light condensing part 110 is spaced apart from the pattern part 220 of the mask 200 by a first distance a. The irradiating part 400 is spaced apart from the light condensing part 110 by a second distance b. The pattern part 220 of the mask 200 is spaced apart from the target substrate 300 by a third distance c. The light condensing part 110 is spaced apart from the target substrate 300 by a fourth distance c'.

The irradiating part 400 is spaced apart from the target substrate 300 by some distance. In one exemplary embodiment, the second distance b is much greater than the first, the third and the fourth distances a, c and c'. Since the second distance b is relatively large, there is a relatively small difference when the light generated at the irradiating part 400 is directly irradiated to the pattern part 220 of the mask 200 without the light blocking member 100 compared to when the light is irradiated to the target substrate 300 with the light blocking member 100.

The first distance a, which is a distance between the light condensing part 110 and the pattern part 220 of the mask 200, is greater than the third distance c, which is a distance between the pattern part 220 of the mask 200 and the target substrate 300. Thus, there is a relatively large difference when the light generated at the irradiating part 400 is irradiated to the target substrate 300 through the pattern part 220 of the mask 200 without the light condensing part 110 compared to when the light is irradiated to the target substrate 300 with the light condensing part 110. The first distance a is about 15 mm, and the third distance c is about 200 μm to about 300 μm. Thus, the first distance a is substantially the same with the fourth distance c'.

When using the light blocking member 100, the most light error occurs at an area of the first distance a. With respect to the light blocking member 100, the light error occurs in an area between an edge of the body part 120 and the pattern part 220 of the mask 200. Thus, the light error is generated by the difference in exposure between a non-exposure area defined by the body part 120 of the light blocking member 100 and an exposure area excluding the body part 120, such that the light error occurs at the side of the light blocking member 100.

However, in the exemplary embodiment, the light condensing part 110 compensates the light error occurring at the side of the light blocking member 120, e.g., where the non-exposure area defined by the body 120 ends. Since the light condensing part 110 compensates the light error, the boundary between the non-exposure area where the light is blocked by the body 120 and the exposure area where the light is not blocked by the body 120, becomes clearer.

The convex lens of the light condensing part 110 may have substantially the same focus distance as the first distance a between the light condensing part 110 and the pattern part 220 of the mask 200. When the focus distance of the convex lens is the same as the first distance a, the light condensing part 110 compensates the light within the first distance a. Moreover, the focus distance of the convex lens of the light condensing part 110 may be about 15 mm. When the first distance a is about 15 mm, the convex lens may be designed to have the focus distance of about 15 mm.

Moreover, the diameter of the convex lens of the light condensing part 110 may be greater than a parameter, which is a value obtained by multiplying the first distance a by tan θc. The angle θc is a collimation angle of the irradiating part. When the diameter of the convex lens is greater than the parameter obtained by multiplying the first distance a by tan θc, the light error is compensated more precisely. Thus, where a collimation angle of a normal irradiating part is about 1.8 degrees, and a first distance is about 15 mm, the diameter of the convex lens may be more than about 470 μm.

Figure 7:
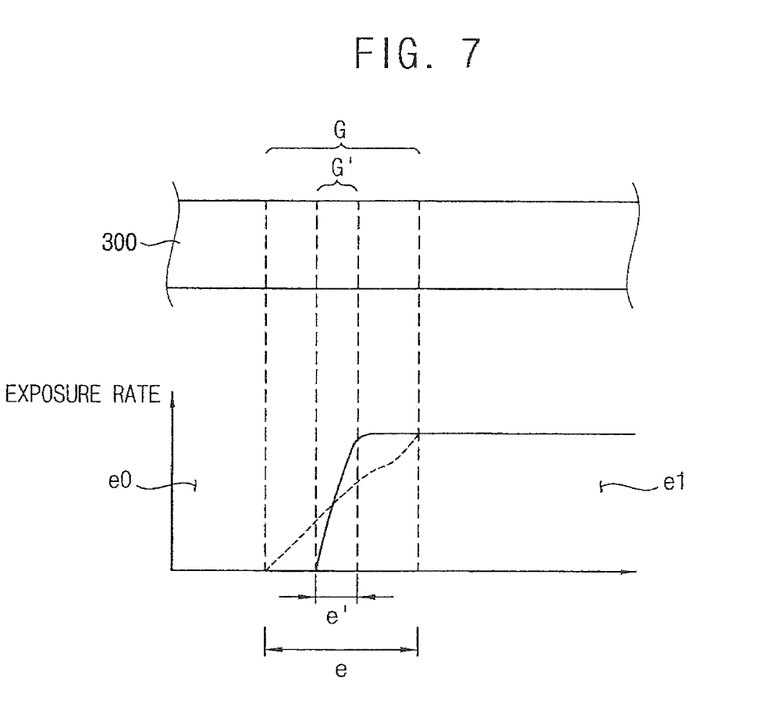
FIG. 7 is a graph illustrating an exposure rate according to a position of a glass substrate exposed by the exposure apparatus in FIG. 1.

FIG. 7 is a graph illustrating an exposure rate according to a position of a glass substrate exposed by the exposure apparatus in FIG. 1.

Referring to FIG. 7, the exposure rate of the target substrate 300 includes a first rate e0 when the light is not exposed (e.g., is blocked) by the light blocking member 100 and a second rate e1 when the light is not passed through (e.g., is not blocked by) the light blocking member 100.

The light passing by the side of the light blocking member 100 exposes a target substrate by an exposure rate between the first rate e0 and the second rate e1. The gray zone G of the target substrate is relatively wide when the light blocking member 100 does not include the light condensing part 110. The gray zone G of the target substrate is exposed by an exposure rate e between the first rate e0 and the second rate e1.

In the exemplary embodiment, the gray zone G' of the target substrate 300 is narrower than the gray zone G. The gray zone G' is exposed to an exposure rate range e', which is smaller than the exposure rate range e. In the gray zone G and G', since the thickness of the pattern formed on the target substrate is not regular, the contact hole in the gray zone G and G' may cause a malfunction in pattern, for example, a circuit using the pattern. In the exemplary embodiment, Since the gray zone G' of the target substrate 300 is narrower than the gray zone G due to the light condensing part 100 of the light blocking member 100, the gray zone G' may be reduced.

As mentioned above, according to one or more exemplary embodiments of the invention, a light blocking member blocks a part of light provided from a irradiating part. An edge area, at which a material of a target substrate is not exposed to the light, may be formed in a large substrate by using a plurality of small masks. Moreover, a light condensing part of the light blocking member, which is disposed at a side of the light blocking member, reduces a light error of the light from the irradiating part. The boundary between an exposed area of the target substrate and a non-exposed area (e.g., an edge area) may be smaller and clearer.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. An exposure apparatus comprising:
    an irradiating part which irradiates light in an irradiation direction;
    a light blocking member including a light condensing part at a side of the light blocking member in a plane perpendicular to the irradiation direction, wherein the light condensing part condenses the light;
    a mask which is spaced apart from the light blocking member by a first distance; and
    a transporting part which transports a target substrate in a first direction.

2. The exposure apparatus of claim 1,
    wherein the light condensing part of the light blocking member comprises a lens.

3. The exposure apparatus of claim 2,
    wherein the light condensing part of the light blocking member comprises a convex lens.

4. The exposure apparatus of claim 3,
    wherein a focus distance of the convex lens of the light condensing part is substantially the same as the first distance.

5. The exposure apparatus of claim 3,
    wherein a focus distance of the convex lens of the light condensing part is about 15 millimeters.

6. The exposure apparatus of claim 3,
    wherein a diameter of the convex lens is more than a parameter defined by multiplying the first distance by tan θc, where θc is defined as a collimation angle of the irradiating part.

7. The exposure apparatus of claim 3,
    wherein a diameter of the convex lens is greater than about 470 micrometers.

8. The exposure apparatus of claim 1,
    wherein the first distance is less than about 20 millimeters.

9. The exposure apparatus of claim 8,
    wherein the first distance is about 15 millimeters.

10. The exposure apparatus of claim 1,
    wherein a longitudinal axis of the light blocking member is extended in a second direction substantially perpendicular to the first direction, and a longitudinal side of the light blocking member is parallel to the longitudinal axis, and
    a longitudinal axis of the light condensing part is parallel with the longitudinal side of the light blocking member.

11. The exposure apparatus of claim 10,
wherein the light condensing part is at opposing longitudinal sides of the light blocking member in the plane perpendicular to the irradiation direction.

12. The exposure apparatus of claim 10,
wherein a width of the light blocking member in the first direction is substantially the same as a width of a non-exposure area of the target substrate in the first direction.

13. The exposure apparatus of claim 1,
wherein the light blocking member is movable in the first direction with respect to the mask.

14. The exposure apparatus of claim 13,
wherein an exposure rate of the target substrate is controlled by a moving speed or a moving accelerated speed of the light blocking member.

15. The exposure apparatus of claim 13,
further comprising a plurality of light blocking members,
wherein the light blocking members are at different heights from each other with respect to the target substrate, are overlapped with each other and define a width of an non-exposure area of the target substrate by adjusting an overlapping area of the light blocking members.

16. The exposure apparatus of claim 15,
wherein a width of each of the light blocking members in the first direction is smaller than a width of the non-exposure area of the target substrate in the first direction.

17. The exposure apparatus of claim 16,
wherein each of the light blocking members has a different width.

18. The exposure apparatus of claim 1,
further comprising a plurality of masks which is arranged in two rows.

19. The exposure apparatus of claim 18, wherein
the plurality of masks is spaced apart from each other by a width of a non-exposure area of the target substrate, and
a longitudinal axis of the non-exposure area is extended in a direction substantially parallel to the first direction.

20. A method of exposing a target substrate, the method comprising:
generating light by an irradiating part and irradiating the light in an irradiation direction towards a mask;
selectively blocking a portion of the light by a light blocking part of a light blocking member which is between the irradiating part and the mask, wherein the mask is spaced apart from the light blocking member by a first distance;
condensing light which passes adjacent to an edge of the light blocking part by a light condensing part of the light blocking member, wherein the light condensing part is at a side of the light blocking part in a plane perpendicular to the irradiation direction; and
transporting the target substrate in a first direction by a transporting part, and positioning the target substrate to overlap with the mask, the light blocking member and the irradiated light.

* * * * *